US006389567B2

(12) United States Patent
Porteners et al.

(10) Patent No.: US 6,389,567 B2
(45) **Date of Patent: *May 14, 2002**

(54) TESTABLE IC HAVING ANALOG AND DIGITAL CIRCUITS

(75) Inventors: Gaston M. I. Porteners; Robert H. De Nie; Johannes Th. Van Der Heiden; Roland P. Jansen; Petrus A. L. De Jong; Petrus A. J. M. Palm; Vincent Pronk, all of Nijmegen (NL)

(73) Assignee: Koninklijke Philips Electronics N.V., Eindhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/293,925

(22) Filed: Apr. 16, 1999

(30) Foreign Application Priority Data

Apr. 23, 1998 (EP) .......................................... 98201314

(51) Int. Cl.[7] ............................................. G01R 31/28
(52) U.S. Cl. ..................................... 714/733; 714/724
(58) Field of Search ............................... 714/726, 733, 714/727, 724, 728; 324/763

(56) References Cited

U.S. PATENT DOCUMENTS 5,448,575 A * 9/1995 Hashizume ................. 714/727
5,477,548 A 12/1995 Beenker et al. .............. 371/2.3
5,568,493 A * 10/1996 Morris ....................... 714/726
5,574,733 A * 11/1996 Kim .......................... 714/728
5,577,052 A * 11/1996 Morris ....................... 714/733
5,602,855 A * 2/1997 Whetsel, Jr. ................ 714/727
5,617,037 A * 4/1997 Matsumoto ................. 324/763
5,648,733 A * 7/1997 Worrell et al. ................ 326/86
5,793,778 A * 8/1998 Qureshi ...................... 714/727
5,974,578 A * 10/1999 Mizokawa et al. ......... 714/727
6,131,173 A * 10/2000 Meirlevede et al. ........ 714/726

* cited by examiner

*Primary Examiner*—David Ton
(74) *Attorney, Agent, or Firm*—John Vodopia

(57) ABSTRACT

The invention relates to an integrated circuit with at least an analog and a digital circuit that are interconnected by a signal path. In order to enable separate testing of the circuits, for example in accordance with the macro test approach, in the signal path a special seam circuit (200) is inserted. The seam circuit (200) is essentially a feedback loop (214) having a scannable flip-flop (210) and a multiplexer (220). The flip-flop (210) feeds a first input of the multiplexer (220), whereas a second input of the multiplexer (220) establishes an input (230) of the seam circuit (200). An output of the feedback loop (214) establishes an output of the seam circuit (200). The state of the multiplexer (220) defines the state of the seam circuit (200), in a first state of the multiplexer (220) the seam circuit (200) being transparent for signals being transferred along the signal path from one circuit to another, and in a second state of the multiplexer (220) the seam circuit (200) outputting a signal that was loaded in the feedback loop (214) beforehand.

8 Claims, 3 Drawing Sheets

TESTABLE IC HAVING ANALOG AND DIGITAL CIRCUITS

FIELD OF THE INVENTION

The invention relates to an integrated circuit (IC) comprising at least one analog circuit, at least one digital circuit and at least one signal path between the analog circuit and the digital circuit.

BACKGROUND OF THE INVENTION

Such circuits are found in a number of applications. An example in the area of video processing is a so-called one-chip TV, which is an IC that performs all television-specific signal processing, both analog and digital. For reasons of design and test efficiency, design of such an IC runs along the lines of identifying a number of more or less independent subfunctions and implementing these subfunctions as separate circuits or functional blocks, also called cores or macros. In a later design stage, the various (analog and digital) macros are interconnected through a number of signal paths, thereby eventually enabling the IC to perform its intended functionality.

Production testing of such an IC is preferably carried out according to the macro test concept, i.e. all macros are tested individually, rather than that the IC is tested as a whole. For further information on macro testing reference is had to U.S. Pat. No. 5,477,548.

The presence of the signal path between the analog and the digital macro poses a number of problems when separately testing these macros. If the signal path establishes an input to the digital macro, for the test of the digital macro it represents an uncontrollable input, whereas for the test of the analog macro, the signal path forms an unobservable output. Similar problems occur when the signal path establishes an input to the analog macro.

A well known approach to enhance observability and controllability in a digital circuit is to use a scan-based design. In a scan-based design, the memory elements (e.g. flip-flops) are not only connected to each other via normal data paths, establishing the intended functionality of the circuit, but also via so-called scan data paths, which establish one or more so-called scan chains. A scan chain is essentially a shift register that allows the memory elements therein to be loaded and unloaded serially, in that way allowing the digital circuit to be tested according to the scan test principle. The scan test principle works as follows. Firstly, the digital circuit is put to a scan state, during which test patterns are shifted into the scan chains. Secondly, the digital circuit is put to an execution state, which results in response patterns being generated in the scan chains under influence of the loaded test patterns. Thirdly, after putting the digital circuit into the scan state again, the response patterns are shifted out from the scan chains for evaluation. This sequence can be repeated for a large number of test patterns and combinations of input signals. Faults result in deviating response patterns.

If the digital macro is intended to have a scan based design, the lack of controllability and observability of the signal path could be reduced by taking care that the signal path on the boundary of the digital circuit passes through a scannable memory element, i.e. through a memory element that is part of a scan chain. Again assuming that the signal path is an input to the digital macro, the scannable memory element provides an instrument for observing signals produced by the analog macro, and for controlling incoming signals to the digital macro. The same applies to the situation that the signal path provides an input to the analog macro. Such kind of configuration, however, offers only limited test opportunities for the analog and the digital macro.

SUMMARY OF THE INVENTION

It is an object of the invention to provide an IC as specified in the preamble which offers a broader range of test opportunities for testing the analog and the digital macro. To this end, the circuit according to the invention is characterized in that the signal path between the analog and the digital macro passes through a seam circuit via a seam input and a seam output thereof, the seam circuit comprising a feedback loop having a seam memory element being part of a scan chain and a seam multiplexer, the seam memory element feeding a first input of the multiplexer, a second input of the multiplexer representing the seam input, an output of the feedback loop representing the seam output. In this way, a first state of the multiplexer allows loading of a data bit into the feedback loop via the seam input, and a second state of the multiplexer freezes the data bit in the feedback loop.

The seam circuit provides an observable and controllable node on the interface signal path between the digital and the analog macro. When the seam multiplexer is operated in the first state, an incoming signal at the seam input is presented to the input of the seam memory element so that it can be stored to be observed later on by appropriate shifting operations of the corresponding scan chain. Moreover, when the seam multiplexer is in the first state, the seam circuit is transparent or signals between the macros. When the seam multiplexer is operated in the second state, the outgoing signal at the seam output is determined by the value that is stored in the scannable memory element, which value can be loaded therein beforehand by appropriate shifting operations of the corresponding scan chain.

When the seam circuit is inserted in a signal path that provides an input to the digital macro, it further provides a way to really isolate the analog macro from the digital macro. This is particularly advantageous if the digital macro is to be tested by means of IDDQ testing. In IDDQ testing, use is made of the fact that a faultless CMOS IC draws a very low quiescent power-supply current (IDDQ). A number of faults, however, such as shorts, increase the power-supply current substantially if the IC is provided with appropriate test patterns activating the fault. By measuring the power-supply current to the digital macro, such faults can be detected. It is very important that while measuring the power-supply current, the digital macro is truly in a steady state. When, however, the signal path carries an asynchronous analog signal, that signal induces currents in the first stages of one or more memory elements, giving rise to a higher power-supply current, which conceals the faults to be detected. With the seam circuit in the signal path, this is avoided by putting the seam circuit in the second state. In the second state, the analog signal is disconnected from the digital macro and can no longer influence the IDDQ measurement, whereas the input of the memory element receives a well-defined signal from its own output. Thus, the seam circuit enables the digital macro to be tested by means of IDDQ as it provides a way to make the inputs to the digital macro stable. Moreover, the added seam circuit itself has a high test coverage.

Furthermore, when there is a plurality of signal paths between the macros, each of which signal paths being provided with a seam circuit, the fact that, in the second mode, the seam circuit output remains stable when the seam circuit is clocked, can be used advantageously when testing either one of the macros. This works as follows. By putting the seam circuits in signal paths that form outputs of the macro to be tested in the first state and the seam circuits in signal paths that form inputs to that macro in the second state, the outputs of the macro can be observed while the inputs are kept stable. This is particularly advantageous while testing the analog macro, if the analog macro through the signal paths receives control signals that are required for its proper setting. By keeping the input signals stable, disturbance of the analog macro is avoided. Such disturbance can better be avoided as it requires the analog macro to settle first before testing can proceed, thereby increasing total test time. Depending on the kind of analog macro and the kind of input signal, the settling time could be as high as 1 ms or even higher.

A first type of seam circuit is defined by the embodiment of the invention according to claim 2. The first type of seam circuit introduces a delay in the signal path that only comprises the delay of the multiplexer. A second type of seam circuit is defined by the embodiment of the invention according to claim 3. The second type of seam circuit is particularly advantageous in case a scannable flip-flop in the signal path is present anyway. Then the incorporation of the seam circuit hardly increases circuit area.

The embodiment of the invention according to claim 4 has the advantage that, while shifting in new test data/shifting out response data via the scan chain, the output of the seam circuit can be kept silent by means of the latch. This is particularly useful for signal paths providing an input to the analog macro. If to such an input a train of pulses would be presented, this could well cause disturbances in the analog macro, requiring some time for the analog macro to settle before testing can proceed after a shift operation. This wastes valuable test time.

The embodiment of the invention according to claim 5 has the advantage that the memory elements of the seam circuits can be read and written fast via the second scan chain, as the memory elements of the digital macro are in a way bypassed. Furthermore, the embodiment has the advantage that in the second test mode thereof it allows the digital macro to run in normal mode while simultaneously providing access to the seam memory elements via the second scan chain. This is particularly advantageous in case the analog macro requires dynamic input signals with a particular functional timing behaviour from the digital macro. By allowing the digital macro to run in normal mode, it can generate the dynamic input signals, whereas via the second scan chain other (static) input signals can be applied to the analog macro, and output signals of the analog macro can be sampled and accessed. A further advantage of the embodiment is that the analog macro can be tested even when the digital macro has faults, notably faults affecting the first scan chain. This is handy during the development process when first silicon is produced. Being able to determine whether or not the analog macro is faultless is already valuable information in that stage.

Non-prepublished International Application PCT/IB97/01346, corresponding to U.S. patent application Ser. No. 08/959782) describes an IC comprising a first and a second clock domain being respectively controlled by a first and a second clock signal, the first clock domain and the second clock domain being interconnected via a set of signal paths, each of which comprising a respective string of flip-flops, an initial flip-flop of the string being located in the first clock domain and a final flip-flop of the string being located in the second clock domain, the string being arranged for serially moving a data bit along its flip-flops from the first to the second clock domain under control of the first and the second clock signals. Each one of the signal paths includes a seam circuit comprising: a seam input; a seam output; a feedback loop having a seam multiplexer and a seam flip-flop being part of the relevant string and being part of a scan chain, the seam flip-flop feeding a first input of the multiplexer, a second input of the multiplexer representing the seam input, an output of the feedback loop representing the seam output; so that a first state of the multiplexer allows loading of a data bit into the feedback loop via the seam input, and a second state of the multiplexer freezes the data bit in the feedback loop. That PCT application does not disclose interconnected analog and digital circuits.

These and other aspects of the invention will be apparent from and elucidated with reference to the embodiments described hereinafter.

DESCRIPTION OF THE INVENTION

Figure 1:
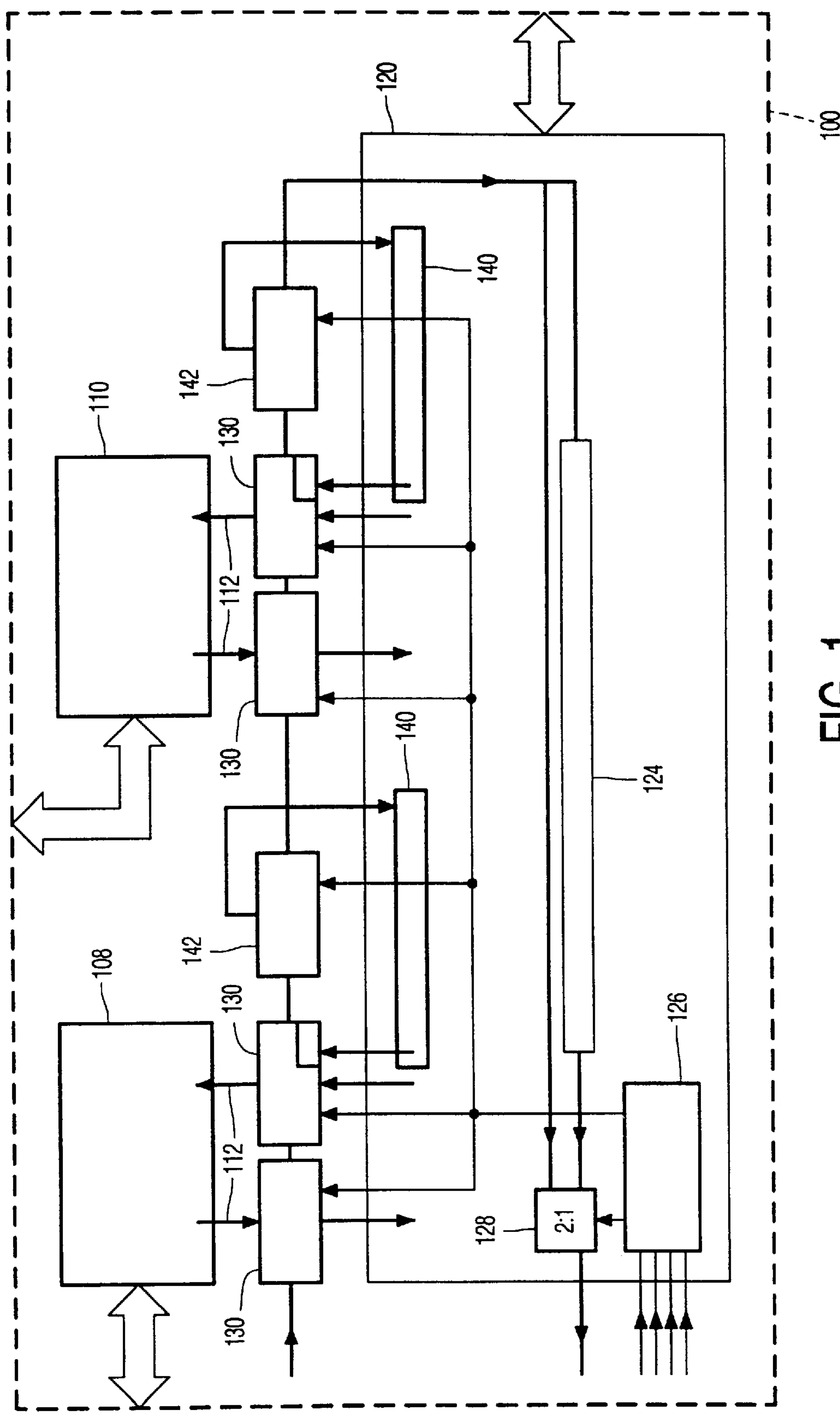
FIG. 1 shows an IC in accordance with the invention.

FIG. 1 shows an IC 100 in accordance with the invention. The IC 100 comprises two analog macros 108, 110 and a digital macro 120. The analog macros 108, 110 are connected to the digital macro 120 through a number of signal paths 112. The digital macro 120 comprises scannable memory elements in the form of flip-flops 124, that are concatenated into a first scan chain. While testing the macros 108, 110, 120 separately, the flip-flops 124 could be used for controlling and observing signals transferred between the macros 108, 110, 120 via the signal paths 112. A disadvantage of such an approach is that, while testing for example analog macro 108, observing an output signal thereof by clocking the flip-flops 124 would normally also cause input signals to that analog macro 108, e.g. control signals, to alter. In this way, the analog macro 108 gets disturbed and needs to settle down before testing can proceed, which causes test time to increase. Furthermore, it is hard to observe individual output signals from the analog macros 108, 110 when they are combined through combinatory logic before entering the flip-flops 124 of the first scan chain. Moreover, testing the digital macro 120 by means of IDDQ is hard, as input signals of the digital macro produced by the analog macro induce input stages of some of the flip-flops 124 to switch, causing an increased power-supply current level.

To overcome these problems, in accordance with the invention the signal paths 112 are provided with seam circuits 130. The seam circuits 130 establish an observable and controllable boundary between the analog macros 108, 110 and the digital macro 120. Hereto, the seam flip-flops are scannable, which, in the particular implementation of IC 100, is accomplished by chaining the seam flip flops in a second scan chain. The IC 100 further comprises a global test control block (TCB) 126 for, among others, selecting whether the seam circuits 130 should pass on data along the normal data paths, comprising the signal paths 112, or along the scan data paths, i.e. the scan chains. Alternative ways of controlling the seam circuits are of course possible.

A multiplexer 128 is provided for selecting between a first and a second test mode, the first and the second scan chain being operable as a single scan chain in the first test mode and the second scan chain being operable independently of the first scan chain in the second test mode. In the second test mode, the flip-flops 124 of the first scan chain are bypassed, whereas the clock signal provided to the seam flip-flops is independent of the clock signal of the digital macro 120. This allows that reading and loading of the seam flip-flops via scan can take place without interfering with the operation of the digital macro 120. Various alternative configurations with respect to the scan chains are possible, e.g. if there are enough pins available, a dedicated pair of pins could be reserved for the second scan chain.

In addition to the seam circuits 130, that are inserted into corresponding signal paths 112, the second scan chain optionally has seam circuits 142 feeding control logic circuits 140. These control logic circuits 140 are inserted for providing control signals to the other seam circuits 130, thereby establishing a second source of control signals besides the TCB 126.

Figure 2:
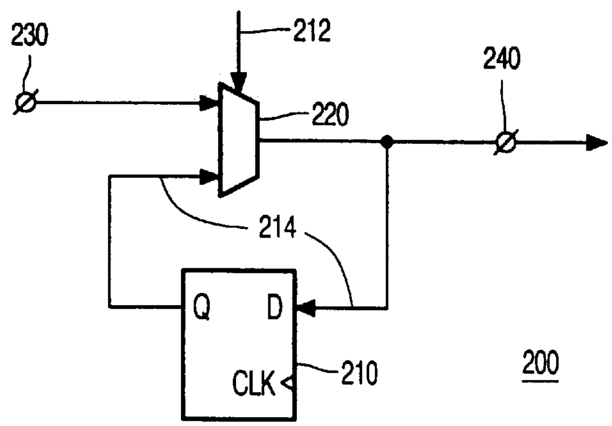
FIG. 2 shows a schematic view of a first type of seam circuit in accordance with the invention.

FIG. 2 shows a schematic view of a first type of seam circuit 200 in accordance with the invention. It comprises a seam flip-flop 210, a seam multiplexer 220, that is controlled by a direction control signal 212, a seam input 230 and a seam output 240. It is silently understood that the seam flip-flop 210 is scannable or, in other words, takes part in a scan chain, although the means necessary therefore (e.g. a further multiplexer) are not explicitly shown. The connections of the seam flip-flop 210 and the seam multiplexer 220 establish a feedback loop 214. The seam circuit 200 has a first and a second state, corresponding to the first and the second state of the seam multiplexer 220, respectively. The state the seam multiplexer 220 is in, is determined by a control signal 212 that is provided to the seam circuit 200 by the TCB 126. Alternative sources for the control signal 212 are, for example, dedicated seam circuits. In the first state, the seam multiplexer 220 will pass on a signal it receives on the seam input 230 to the seam output 240, allowing loading of a data bit into the feedback loop 214, under control of a clock signal provided to the clock input CLK. In the second state the data bit is frozen in the feedback loop 214.

During a normal mode of the IC, the seam circuit 200 is operated in the first state. The stored copy of the interface signal in the seam flip-flop 210 then, is not utilized, and it is not relevant whether the seam flip-flop receives a clock signal. In a test mode of the IC, both the first and the second state of the seam circuit 200 can be utilized. In the first state, the seam circuit 200 stores a sample of the signal at the seam output 240 in the seam flip-flop 210. In a scan state of the IC, this value can be shifted out. Thus, observability is obtained of the node that is formed by seam output 240. In the second state, the seam circuit 200 drives the seam output 240 with the signal value shifted in the seam flip-flop 210 in the preceding scan state of the circuit, while at the same time, the seam circuit 200 is ignorant about changes at the seam input 230, regardless whether a clock signal is provided. In this way, the signal on the seam output 240 is controlled.

Figure 3:
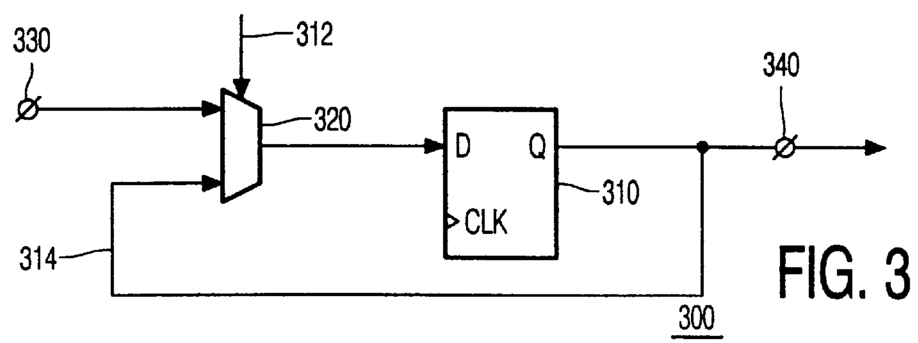
FIG. 3 shows a schematic view of a second type of seam circuit in accordance with the invention.

FIG. 3 shows a schematic view of a second type of seam circuit 300 in accordance with the invention. It comprises a seam flip-flop 310, a seam multiplexer 320 having a first and a second state under control of a signal 312, a seam input 330 and a seam output 340. The second type of seam circuit 300 differs from the first type of seam circuit 200 in that a feedback loop 314 is formed through connecting seam output 340 to the output of the seam flip-flop 310 instead of to the output of the seam multiplexer 320. The operation of the second type of seam circuit 300 is analogous to the operation of the first type of seam circuit 200. The fact that in the second type of seam circuit 300 the signal path passes through the seam flip-flop 310 can be advantageous in some cases.

Figure 4:
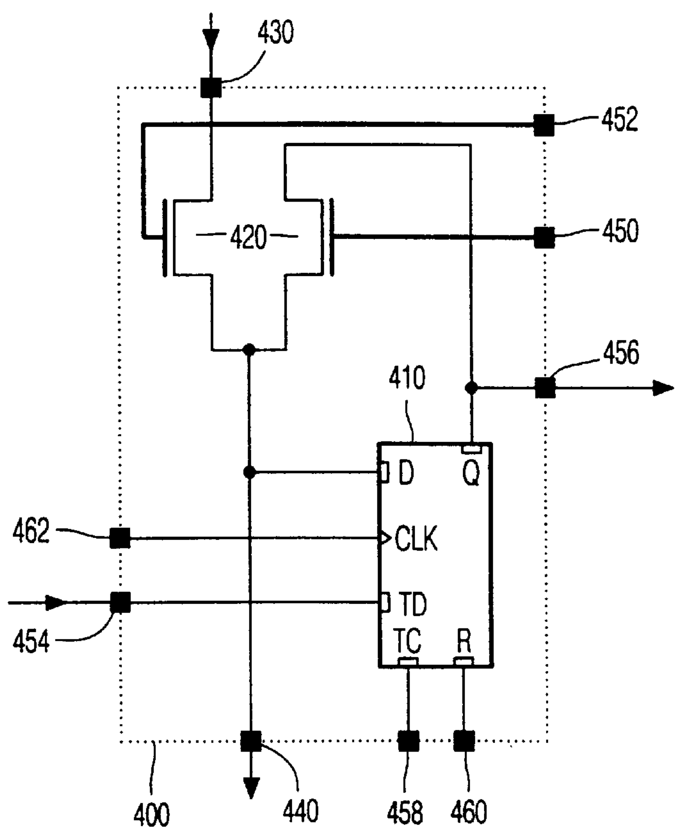
FIG. 4 shows a first embodiment of the first type of seam circuit in accordance with the invention.

FIG. 4 shows a first embodiment of the first type of seam circuit in accordance with the invention. The seam circuit 400 comprises a seam input 430 for connection to an output of an analog macro, and a seam output 440 for connection to an input of a digital macro. The seam circuit 400 further comprises a seam flip-flop 410 and a seam multiplexer 420. The term seam multiplexer in the context of this text should be understood as a functional description, in the sense that any circuit is meant that allows selection of either one of its input signals (in the present embodiment provided by either the seam input 430 or an output of the seam flip-flop 410) to be passed on. The seam multiplexer 420 is implemented as a pair of gates under control of control nodes 450, 452, that carry control signals that are each other's inverse and are provided by the TCB 126. A pair of control nodes 458, 460 is provided for switching the seam flip-flop 410 between a scan state and a normal state and for resetting the seam flip-flop 410, respectively. In a scan state, the seam flip-flop 410 receives test data on its TD input via test data input node 454, which forms a part of a scan data path with test data output node 456, whereas in a normal state the seam flip-flop 410 receives data on its D input through seam multiplexer 420. A control node 462 is provided for application of a clock signal to the seam flip-flop 410.

Figure 5:
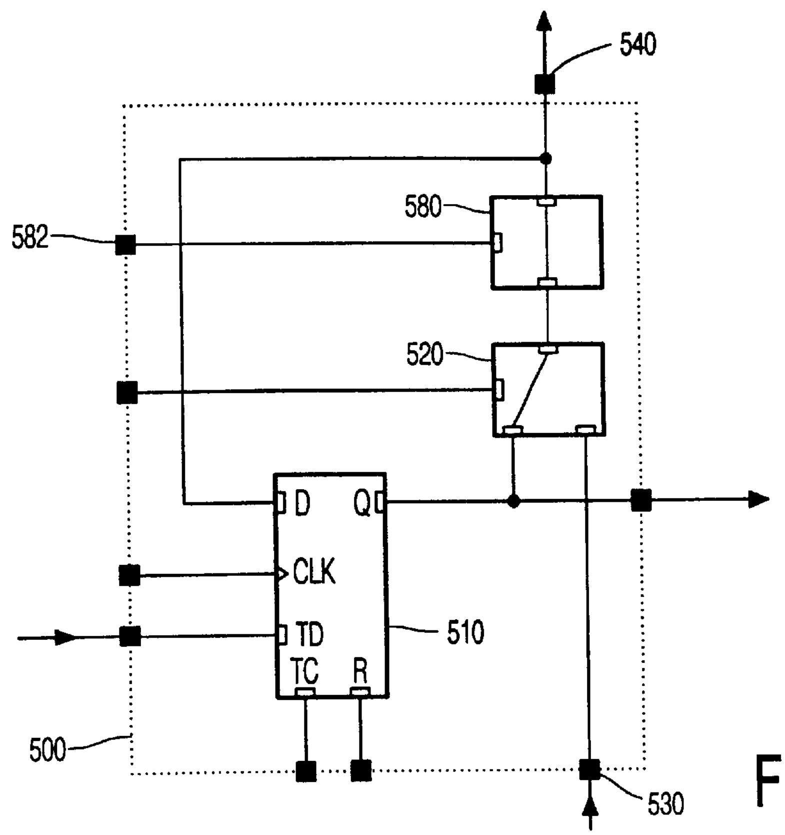
FIG. 5 shows a second embodiment of the first type of seam circuit in accordance with the invention.

FIG. 5 shows a second embodiment of the first type of seam circuit in accordance with the invention. The seam circuit 500 comprises a seam input 530 for connection to an output of a digital macro, and a seam output 540 for connection to an input of an analog macro. The seam circuit 500 further comprises a seam flip-flop 510 and a seam multiplexer 520. In comparison with the first embodiment, the seam circuit 500 additionally comprises a latch 580 under control of an additional control signal that is provided on node 582. With the aid of the latch 580, the seam output 540 either follows an output of the seam multiplexer 520 or is kept silent. The latter option can be advantageously used while shifting data along the scan chain, so that an analog macro that receives a control signal from the seam output 540 does not get disturbed while scanning data.

As can be seen in FIG. 4 and FIG. 5, both embodiments of the first type of seam circuit provide a normal data path through the seam circuit without passing through a seam flip-flop.

Figure 6:
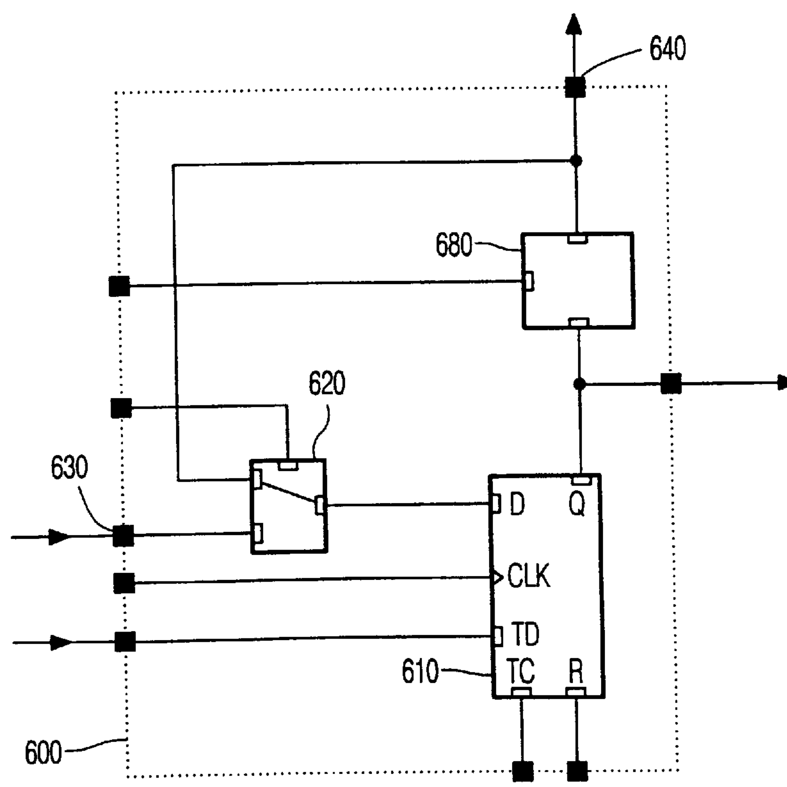
FIG. 6 shows an embodiment of the second type of seam circuit in accordance with the invention.

FIG. 6 shows an embodiment of the second type of seam circuit in accordance with the invention. A seam flip-flop 610, a seam multiplexer 620 and a latch 680 are connected such, that the normal data path between seam input 630 and the seam output 640 runs through the seam flip-flop 610. It will be clear that the second type of seam circuit in the normal requires a clock signal provided to its clock input CLK in order for the seam flip-flop 610 to be able to pass on signals from its D-input to its Q-output. The fact that the seam flip-flop is comprised in the normal data path is prescribed in some cases anyway, for example in combination with 12C logic. In those eases, the seam circuit 600 only marginally adds to the IC area.

In brief, a preferred embodiment of the invention relates to an integrated circuit with at least an analog and a digital circuit that are interconnected by a signal path. In order to enable separate testing of the circuits, for example in accordance with the macro test approach, in the signal path a special seam circuit is inserted. The seam circuit is essentially a feedback loop having a scannable flip-flop and a multiplexer. The flip-flop feeds a first input of the multiplexer, whereas a second input of the multiplexer establishes an input of the seam circuit. An output of the feedback loop establishes an output of the seam circuit. The state of the multiplexer defines the state of the seam circuit, in a first state of the multiplexer the seam circuit being transparent for signals being transferred along the signal path from one circuit to another, and in a second state of the multiplexer the seam circuit outputting a signal that was loaded in the feedback loop beforehand.

It should be noted that the above-mentioned embodiments illustrate rather than limit the invention and that those skilled in the art will be able to design many alternative embodiments without departing from the scope of the appended claims. In the claims, any reference signs placed between parentheses shall not be construed as limiting the claim.

What is claimed is:

1. Integrated circuit comprising at least one analog circuit, at least one digital circuit and at least one signal path providing an observable and controllable node on the at least one signal path between the analog circuit and the digital circuit such that a broad range of analog and digital test opportunities are provided, wherein said signal path comprises a seam circuit, the seam circuit comprising a feedback loop having a seam memory element which is part of a scan chain, and a seam multiplexer, and wherein the seam memory element is coupled between an output and a first input of the seam multiplexer, and a second input of the seam multiplexer is coupled to an input of the seam circuit.

2. Integrated circuit as claimed in claim 1, wherein an output of the seam circuit comprises the output of the seam multiplexer.

3. Integrated circuit as claimed in claim 1, wherein an output of the seam circuit comprises an output of the seam memory element.

4. Integrated circuit as claimed in claim 1, wherein the feedback loop further comprises a latch, an output of which comprises an output of the seam circuit.

5. Integrated circuit as claimed in claim 1, further comprising a plurality of signal paths between the analog circuit and the digital circuit, wherein the signal paths of said plurality comprise respective seam circuits, memory elements of the digital circuit are chained in a first scan chain, seam memory elements of the seam circuits are chained in a second scan chain, the integrated circuit includes structure which enables a first and a second test mode, and wherein the first and the second scan chains are operable as a single scan chain in the first test mode and the second scan chain is operable independently of the first scan chain in the second test mode.

6. The integrated circuit of claim 1, further comprising a plurality of signal paths between at least one analog circuit and the at least one digital circuit, wherein the signal paths of the plurality of signal paths comprise respective seam circuits, where each seam circuit includes a seam memory element, the memory elements of the at least one digital circuit are chained in a first scan chain, the seam memory elements of the seam circuits are chained in a second scan chain, and the second scan chain is operable independent of the first scan chain.

7. An integrated circuit comprising:

at least one analog circuit, at least one digital circuit, and a plurality of signal paths for providing a plurality of observable and controllable nodes, respectively, on said plurality of signal paths between the at least one analog circuit and the at least one digital circuit such that a broad range of analog and digital test opportunities are realized, wherein the signal paths of the plurality of signal paths comprise respective seam circuits, and wherein at least one seam circuit comprises:

a feedback loop that includes a seam memory element and a latch, and a seam multiplexer that couples one of: an input to the at least one seam circuit to an output of the seam memory element, and an input to the at least one seam circuit to an input of the seam memory element, and the latch is configured to prevent propagation of unwanted signals in the seam circuit to the at least one analog circuit associated with the at least one seam circuit.

8. The integrated circuit of claim 7, wherein the memory elements of the at least one digital circuit are chained in a first scan chain, the seam memory elements of the seam circuits are chained in a second scan chain, and wherein the second chain scan is operable independent of the first scan chain.

* * * * *